United States Patent
Jeong et al.

(10) Patent No.: US 10,102,918 B2
(45) Date of Patent: Oct. 16, 2018

(54) SEMICONDUCTOR DEVICE, FOR READING FUSE DATA USING A COMMAND, SEMICONDUCTOR SYSTEM AND OPERATING METHOD THEREOF

(71) Applicant: SK hynix Inc., Icheon-si, Gyeonggi-do (KR)

(72) Inventors: Hyeong Soo Jeong, Yongin-si (KR); Tae Kyun Shin, Icheon-si (KR); Young Bo Shim, Dangjin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/656,138

(22) Filed: Jul. 21, 2017

(65) Prior Publication Data
US 2018/0166144 A1    Jun. 14, 2018

(30) Foreign Application Priority Data
Dec. 8, 2016 (KR) .................. 10-2016-0166648

(51) Int. Cl.
*G11C 17/00* (2006.01)
*G11C 17/18* (2006.01)
*G11C 17/16* (2006.01)

(52) U.S. Cl.
CPC ............ *G11C 17/18* (2013.01); *G11C 17/16* (2013.01)

(58) Field of Classification Search
CPC .................................................. G11C 17/16
USPC ............................................................ 365/96
See application file for complete search history.

(56) References Cited

U.S. PATENT DOCUMENTS

| | | | |
|---|---|---|---|
| 2012/0297150 A1* | 11/2012 | Kang | G06F 21/71 |
| | | | 711/154 |
| 2014/0177313 A1 | 6/2014 | Lee et al. | |
| 2015/0235712 A1 | 8/2015 | Kang | |
| 2016/0118139 A1* | 4/2016 | Shim | G11C 17/18 |
| | | | 365/96 |

FOREIGN PATENT DOCUMENTS

| KR | 1020140081347 A | 7/2014 |
|---|---|---|
| KR | 1020150096951 A | 8/2015 |

* cited by examiner

*Primary Examiner* — Hoai V Ho
(74) *Attorney, Agent, or Firm* — William Park & Associates Ltd.

(57) ABSTRACT

A semiconductor device includes an internal command generation circuit suitable for generating a first internal command, a second internal command, and a third internal command based on a command/address signal. The semiconductor device also includes a driving signal generation circuit suitable for enabling a fuse driving signal for reading fuse data from a nonvolatile memory circuit, where the fuse signal is enabled while the second internal command is inputted a predetermined number of times. Further included is an output circuit suitable for outputting the fuse data in response to the third internal command.

20 Claims, 4 Drawing Sheets

SEMICONDUCTOR DEVICE, FOR READING FUSE DATA USING A COMMAND, SEMICONDUCTOR SYSTEM AND OPERATING METHOD THEREOF

CROSS-REFERENCES TO RELATED APPLICATION

The present application claims priority under 35 U.S.C. § 119(a) to Korean Patent Application No. 10-2016-0166648, filed on Dec. 8, 2016, in the Korean Intellectual Property Office, which is incorporated herein by reference in its entirety.

BACKGROUND

1. Technical Field

Various embodiments generally relate to a semiconductor device, a semiconductor system and an operating method thereof, and more particularly, to reading of data stored in a nonvolatile memory.

2. Related Art

In the conventional art, laser fuses are used to store, in a semiconductor device, various information necessary for operation of the semiconductor device, such as repair information, information for setting an internal voltage, and input/output timing information. A laser fuse stores data by cutting a fuse using laser technology. While programming of a laser fuse is possible at a wafer level, it is impossible to program the laser fuse after a wafer is mounted in a package. Also, it is impossible to design a laser fuse to have a small area, due to a pitch limit.

Due to this fact, recently, a nonvolatile memory circuit such as an e-fuse array circuit, a NAND flash memory, a NOR flash memory, an EPROM (electrically programmable read only memory), an EEPROM (electrically erasable and programmable read only memory), an FRAM (ferroelectric RAM), and an MRAM (magnetic RAM) is being used instead of a laser fuse.

A certain time is required to read out information stored in a nonvolatile memory circuit. Therefore, if power is applied to a semiconductor device, information stored in a nonvolatile memory circuit are transmitted to and stored in latch circuits, and the information stored in the latch circuits are used in a repair information and various setting operations.

Meanwhile, the information stored in a nonvolatile memory circuit includes, in addition to the above-described information necessary for operation of a semiconductor device, manufacturing information of a semiconductor device such as a die ID which represents a portion of a wafer which is positioned on a semiconductor device in a manufacturing procedure when the semiconductor device is manufactured. The manufacturing information of the semiconductor device may be read by a user in need. To this end, the manufacturing information of the semiconductor device may also be stored in latch circuits similar to information on operation of the semiconductor device. However, in this case, separate latch circuits should be disposed on the semiconductor device corresponding to the manufacturing information of the semiconductor device. Consequently, as the size of the semiconductor device is increased, the yield may decrease and costs may increase.

SUMMARY

Various embodiments are directed to a semiconductor device which is capable of reading fuse data stored in a nonvolatile memory by directly accessing the nonvolatile memory through mode register commands.

In an embodiment, a semiconductor device may include: an internal command generation circuit suitable for generating a first internal command, a second internal command, and a third internal command based on a command/address signal; a driving signal generation circuit suitable for enabling a fuse driving signal for reading fuse data from a nonvolatile memory circuit, where the fuse signal is enabled while the second internal command is inputted a predetermined number of times; and an output circuit suitable for outputting the fuse data in response to the third internal command.

In an embodiment, a semiconductor system may include: a controller suitable for generating a second command/address signal a predetermined number of times; and a semiconductor device suitable for generating a second internal command based on the second command/address signal, and retaining an enable state of a fuse driving signal for reading fuse data from a nonvolatile memory circuit while the second internal command is generated the predetermined number of times.

In an embodiment, a method for operating a semiconductor system may include: transmitting a first command/address signal by a controller; enabling a fuse driving signal by a semiconductor device in response to the first command/address signal; transmitting, by the controller, a second command/address signal a predetermined number of times; retaining an enable state of the fuse driving signal by the semiconductor device while the second command/address signal is transmitted the predetermined number of times; and outputting fuse data by a nonvolatile memory circuit based the fuse driving signal.

According to the embodiments, by directly accessing a nonvolatile memory circuit through using mode register commands, it is possible to read fuse data, without generating an additional command. Due to this fact, because latches may be disposed only an amount corresponding to the size of fuse data to be outputted, the area of a semiconductor device may be reduced.

DETAILED DESCRIPTION

Hereinafter, a semiconductor device, a semiconductor system and an operating method thereof will be described below with reference to the accompanying drawings through various examples of embodiments.

Figure 1:
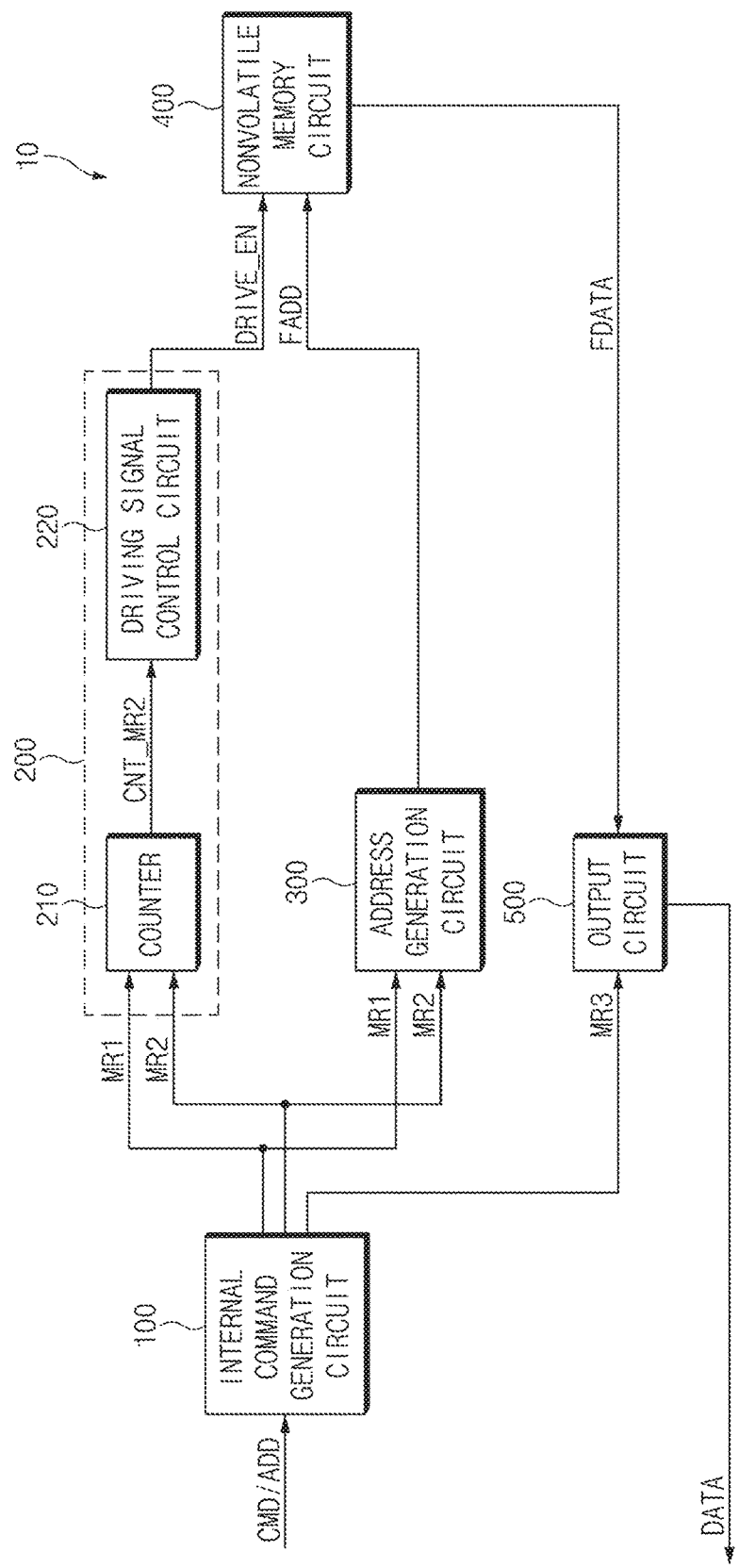
FIG. 1 is a configuration diagram illustrating a representation of an example of a semiconductor device in accordance with an embodiment.

FIG. 1 is a configuration diagram illustrating a representation of an example semiconductor device 10 in accordance with an embodiment.

Referring to FIG. 1, the semiconductor device 10 includes an internal command generation circuit 100 which generates a first mode register command MR1, a second mode register command MR2, and a third mode register command MR3 based on a command/address signal CMD/ADD; a driving signal generation circuit 200 which enables a fuse driving signal DRIVE_EN based on at least one of the first mode register command MR1 and the second mode register command MR2; an address generation circuit 300 which generates a fuse address FADD based on at least one of the first mode register command MR1 and the second mode register command MR2; a nonvolatile memory circuit 400 which outputs fuse data FDATA stored at the fuse address FADD based on the fuse driving signal DRIVE_EN; and an output circuit 500 which outputs the fuse data FDATA to an exterior, based on the third mode register command MR3. The first mode register command MR1, the second mode register command MR2, and the third mode register command MR3 are examples of a first internal command, a second internal command, and a third internal command, respectively. The nonvolatile memory circuit 400 may be any one of an e-fuse array circuit, a NAND flash memory, a NOR flash memory, an EPROM (erasable programmable read-only memory), an EEPROM (electrically EPROM), a FRAM (ferroelectric random access memory), and a MRAM (magnetoresistive random access memory). Hereinafter, for the sake of convenience in explanation, descriptions will be made by taking, as an example, the case where the nonvolatile memory circuit 400 is configured as an e-fuse array circuit.

The internal command generation circuit 100 generates the first mode register command MR1, the second mode register command MR2, and the third mode register command MR3, based on the command/address signal CMD/ADD. For example, the internal command generation circuit 100 generates the first mode register command MR1 when a first command/address signal CMD/ADD is inputted, generates the second mode register command MR2 when a second command/address signal CMD/ADD is inputted, and generates the third mode register command MR3 when a third command/address signal CMD/ADD is inputted. That is to say, the internal command generation circuit 100 may be a decoder of the command/address signal CMD/ADD. The first command/address signal CMD/ADD may have a first value, the second command/address signal CMD/ADD may have a second value, and the third command/address signal CMD/ADD may have a third value. The first value, the second value, and the third value may be values which are different from one another and are set in advance. For example, the first value, the second value, and the third value may be values which correspond to different mode register commands in the specification of the JEDEC (Joint Electron Device Engineering Council).

In general, register sets (RS) are used to define the operation modes of a semiconductor device. The register sets (RS) are configured by mode register sets (MRS) and extended mode register sets (EMRS). The mode register sets and the extended mode register sets are values which are applied to address pins together with mode register setting commands and are used for setting the operation modes of the semiconductor device. Information on the operation modes that are set are retained until the operation modes are programmed again or the semiconductor device is powered off.

The mode register sets are necessary for a synchronous DRAM (dynamic random access memory) or an SRAM (static random access memory), and are to set, before using a chip; or operation modes each of which is configured by a burst type, a burst length, a CAS latency (column address strobe signal latency: CL) and a read latency (RL). The mode register sets may be performed under a test mode for a vendor to inspect a chip, or may be performed under a mode that provides an operation mode setting for a user in the JEDEC specification. The mode register sets include a mode register write (MRW) operation for inputting information of a set mode to registers and a mode register read (MRR) operation for outputting the information of a mode stored in registers.

In the present embodiment, in order to access the e-fuse array circuit 400 and read the fuse data FDATA, a mode register command such as a mode register write command and a mode register read command is used. In other words, a controller (see the reference numeral 20 of FIG. 4) transmits the commands/address signals CMD/ADD corresponding to mode register commands, and the internal command generation circuit 100 generates the mode register commands corresponding to the commands/address signals CMD/ADD, that is, the first mode register command MR1, the second mode register command MR2, and the third mode register command MR3, and the semiconductor device 10 reads the fuse data FDATA based on the first to third mode register commands MR1, MR2 and MR3.

The driving signal generation circuit 200 generates the fuse driving signal DRIVE_EN based on the first mode register command MR1 and the second mode register command MR2. For example, the driving signal generation circuit 200 may enable the fuse driving signal DRIVE_EN in response to the second mode register command MR2 which is inputted a first time, and retain the enable state of the fuse driving signal DRIVE_EN for reading fuse data FDATA from the e-fuse array circuit 400 while the second mode register command MR2 is inputted a predetermined number of times. In other words, the semiconductor device 10 may retain the enable state of the fuse driving signal DRIVE_EN while the second command/address signal CMD/ADD is transmitted the predetermined number of times. To this end, the controller transmits the command/address signal CMD/ADD corresponding to the second mode register command MR2 the predetermined number of times.

In this regard, it may be considered that, in order to read the fuse data FDATA, the controller inputs the command/address signal CMD/ADD corresponding to a mode register command one time. In the JEDEC specification, after a mode register command is inputted, data should be outputted within a predetermined time. For example, in order to read data, data should be outputted approximately 15 ns after a mode register command is inputted.

However, in the e-fuse array circuit 400, there may be a case where the fuse data FDATA may not be read within the predetermined time. Namely, due to characteristics of the e-fuse array circuit 400, the fuse data FDATA may be outputted only when a driving voltage is applied for a longer time than the predetermined time. For example, in the e-fuse array circuit 400, the fuse data FDATA may be outputted when approximately 100 ns elapses after a mode register command is inputted. In this case, the fuse data FDATA may not be read for the scheme of inputting a mode register command one time.

Therefore, in the present embodiment, the fuse data FDATA is read by extending the application time of a driving voltage by generating a mode register command a multitude of times.

The driving signal generation circuit 200 may include a counter 210 and a driving signal control circuit 220. The counter 210 is enabled by the first mode register command MR1, and counts an input count CNT_MR2 which may be a number of times the second mode register command MR2 is inputted to the counter 210. The driving signal control circuit 220 may enable the fuse driving signal DRIVE_EN when the second mode register command MR2 is inputted the first time (that is, when the input count CNT_MR2 of the second mode register command MR2 is 1). While retaining the enable state of the fuse driving signal DRIVE_EN, the driving signal control circuit 220 may disable the fuse driving signal DRIVE_EN when the input count CNT_MR2 of the second mode register command MR2 becomes the predetermined number of times, that is, when the second mode register command MR2 is inputted, for example, 8 times. The input count CNT_MR2 of the second mode register command MR2 by which the fuse driving signal DRIVE_EN is disabled may be set in advance. The predetermined number of times may be set such that the fuse driving signal DRIVE_EN is applied for a time that the fuse data FDATA is able to be outputted from the e-fuse array circuit 400.

The address generation circuit 300 generates the fuse address FADD based on at least one of the first mode register command MR1 and the second mode register command MR2. The fuse address FADD represents the position of a fuse array in the e-fuse array circuit 400 where the fuse data FDATA is stored.

The address generation circuit 300 may count an input of the second mode register command MR2, and increase the fuse address FADD when the input count becomes a predetermined number of times, that is, when the second mode register command MR2 is inputted, for example, 8 times. According to this fact, not only the fuse data FDATA stored at a specified fuse address FADD but also the fuse data FDATA stored at a next fuse address FADD may be read consecutively.

The e-fuse array circuit 400 outputs the fuse data FDATA based on the fuse driving signal DRIVE_EN and the fuse address FADD. The e-fuse array circuit 400 may include, for example, a fuse cell array in which the fuse data FDATA is stored, a row decoder which drives a word line based on the fuse address FADD, a column decoder which drives a bit line based on the fuse address FADD, and a sense amplifier which senses and amplifies the potential of the bit line. The e-fuse array circuit 400 outputs the fuse data FDATA by driving a word line, a bit line, and a sense amplifier corresponding to the fuse address FADD based on the fuse driving signal DRIVE_EN (for example, while the fuse driving signal DRIVE_EN is applied).

The output circuit 500 outputs the fuse data FDATA in response to the third mode register command MR3. The output circuit 500 may output data DATA by controlling the fuse data FDATA outputted from the e-fuse array circuit 400 to conform to a data type corresponding to a mode register command in the JEDEC specification. Because the fuse data FDATA is in a state in which the fuse data FDATA has already been outputted from the e-fuse array circuit 400, the fuse data FDATA may be outputted to an exterior in response to the third mode register command MR3 which is applied one time. Also, the output circuit 500 may output the fuse data FDATA by amplifying it.

Figure 2:
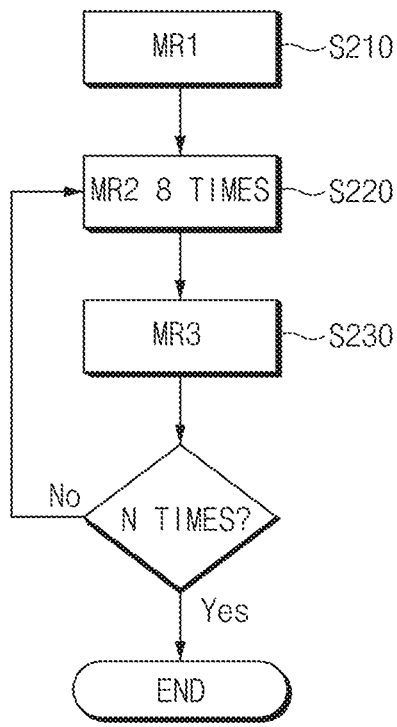
FIG. 2 is a representation of an example of a flow chart to assist in an explanation of a process of generating internal commands by an internal command generation circuit shown in FIG. 1.

FIG. 2 is a representation of an example of a flow chart to assist in an explanation of a process of generating internal commands by the internal command generation circuit 100 shown in FIG. 1.

Referring to FIG. 2, the internal command generation circuit 100 generates a series of mode register commands. In detail, the internal command generation circuit 100 generates the first mode register command MR1 in response to the command/address signal CMD/ADD (S210). The first mode register command MR1 is a signal which indicates that the series of subsequent mode register commands MR2 and MR3 are to be inputted. The first mode register command MR1 may be a mode register command which is not used for setting mode registers or reading mode registers, among mode register commands. The first mode register command MR1 is not limited to a mode register write command, and may be a mode register read command. After receiving the first mode register command MR1, the address generation circuit 300 may generate the fuse address FADD. Generally speaking, the semiconductor device 10 may generate a fuse address FADD in response to the first command/address signal CMD/ADD. Particularly, the semiconductor device 10 may enable the fuse driving signal DRIVE_EN in response to the first command/address signal CMD/ADD.

Next, while not shown in FIG. 1, the internal command generation circuit 100 may generate a stabilization command (DSEL) in response to the command/address signal CMD/ADD. The stabilization command (DSEL) may be applied for stabilizing the power of the e-fuse array circuit 400, and, for example, the driving signal generation circuit 200 may disable the fuse driving signal DRIVE_EN in response to the stabilization command (DSEL).

Then, the internal command generation circuit 100 generates the second mode register command MR2 a predetermined number of times (for example, 8 times) based on the command/address signal CMD/ADD (S220). The driving signal generation circuit 200 enables the fuse driving signal DRIVE_EN in response to the second mode register command MR2 which is inputted before the driving fuse driving signal DRIVE_EN is enabled. The e-fuse array circuit 400 begins to apply the fuse driving signal DRIVE_EN to a fuse cell array corresponding to the fuse address FADD provided from the address generation circuit 300.

The driving signal generation circuit 200 retains the enable state of the fuse driving signal DRIVE_EN while the second mode register command MR2 is inputted 8 times. The e-fuse array circuit 400 applies a driving signal to a fuse cell array corresponding to the fuse address FADD while the fuse driving signal DRIVE_EN is enabled.

The number of times that the second mode register command MR2 is generated may be set sufficiently large such that the fuse data FDATA may be generated by applying the fuse driving signal DRIVE_EN to the e-fuse array circuit 400.

For example, it is assumed that a time required until the fuse data FDATA is actually outputted from the e-fuse array circuit 400, by applying the second mode register command MR2, is 100 ns. Further, it is assumed in the JEDEC specification that a time until data is read after a mode register command is inputted is 15 ns. In this case, the internal command generation circuit 100 generates the second mode register command MR2 8 times, and the driving signal generation circuit 200 enables the fuse driving signal DRIVE_EN from the first time the second mode register command MR2 is inputted to when the second mode register command MR2 is inputted the eighth time, such that the e-fuse array circuit 400 is driven. In other words, a time capable of driving the e-fuse array circuit 400 by each second mode register command MR2 is 15 ns, a time for driving the e-fuse array circuit 400 may be extended to 120 ns by consecutively applying the second mode register command MR2 8 times. Due to this fact, the fuse data FDATA is outputted as the e-fuse array circuit 400 is driven for a sufficient time, that is, a time equal to or longer than 100 ns.

A mode register command which is already being used may be used as the second mode register command MR2. Because the driving signal generation circuit 200 is notified by the first mode register command MR1 that the second mode register command MR2 is to be inputted in a scheme according to the present embodiment.

Any one of a mode register read command and a mode register write command may be used as the second mode register command MR2. Regardless of which one is used, it is sufficient to apply a driving voltage to the e-fuse array circuit 400 and output the fuse data FDATA. After the semiconductor device 10 outputs the fuse data FDATA the controller may transmit the third command/address signal CMD/ADD to the semiconductor device 10.

Next, the internal command generation circuit 100 generates the third mode register command MR3 based on the command/address signal CMD/ADD (S230). The third mode register command MR3 may be a mode register read command.

The third mode register command MR3 is inputted to the output circuit 500. Accordingly, the output circuit 500 converts the fuse data FDATA into the output data DATA which has a data type corresponding to a mode register command, and outputs the output data DATA. Thus, the semiconductor device 10 may output the fuse data FDATA in response to the third command/address signal CMD/ADD.

The step S220 of generating the second mode register command MR2 8 times and the step S230 of generating the third mode register command MR3 may be repeated a multitude of times (N times). In this regard, the address generation circuit 300 increases the fuse address FADD when the second mode register command MR2 is inputted eighth. Due to this fact, the e-fuse array circuit 400 may output the fuse data FDATA N times to output the fuse data FDATA corresponding to an initial fuse address FADD and then output the fuse data FDATA corresponding to an increased fuse address FADD.

Finally, while not shown in FIG. 1, the internal command generation circuit 100 may generate a precharge command (PCG) based on the command/address signal CMD/ADD. Attributable to this fact, the internal signals of the semiconductor device 10 may be returned to their initial values, and the operation for outputting the fuse data FDATA may be ended.

Figure 3:
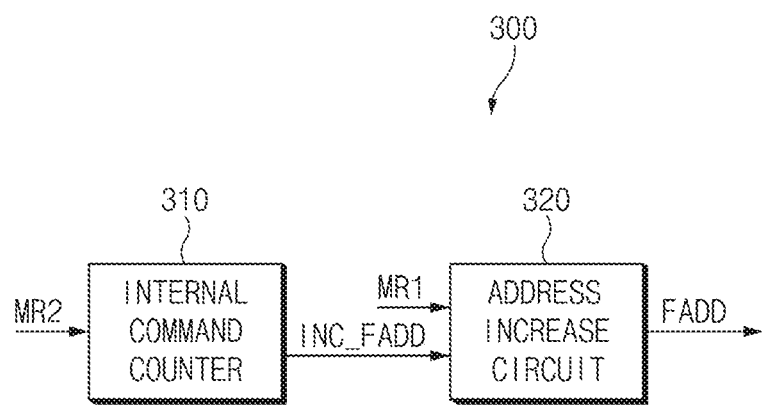
FIG. 3 is a configuration diagram illustrating a representation of an example of an address generation circuit shown in FIG. 1.

FIG. 3 is a configuration diagram illustrating a representation of an example of the address generation circuit 300 shown in FIG. 1.

Referring to FIG. 3, the address generation circuit 300 includes an internal command counter 310 and an address increase circuit 320.

The internal command counter 310 counts the second mode register command MR2 which is generated by the internal command generation circuit 100, and enables an address increase signal INC_FADD when the predetermined number of times is reached. The predetermined number of times may be set to be the same value that the counter 210 of the driving signal generation circuit 200 counts the second mode register command MR2 to retain the enable state of the fuse driving signal DRIVE_EN. For example, the internal command counter 310 may enable the address increase signal INC_FADD when the second mode register command MR2 is inputted 8 times.

The address increase circuit 320 generates the initial fuse address FADD in response to the first mode register command MR1, and generates and increases the fuse address FADD in response to the address increase signal INC_FADD. The value of the initial fuse address FADD may be a value which is set in advance.

For example, according to the present embodiment, the fuse data FDATA may be specific data such as a die ID. The die ID, may be an ID which represents the semiconductor device 10 constructing a wafer at the wafer level of the semiconductor device 10 in a manufacturing procedure, is data which designates the position of the semiconductor device 10 on the wafer and a date of manufacture. Such a die ID may be stored at a specified position in the e-fuse array circuit 400.

A user may access the e-fuse array circuit 400 to obtain the die ID. In this case, because the position of the e-fuse array circuit 400 to access is specified, the initial value of the fuse address FADD may be set in advance.

In the case where the user wants to access an optional position of the e-fuse array circuit 400 but not the specified position of the e-fuse array circuit 400, the initial value of the fuse address FADD may be set separately.

The fuse address FADD may be, for example, a row address of the e-fuse array circuit 400. Also, the fuse address FADD may have a value which is obtained by increasing a row address by 1 bit in response to the address increase signal INC_FADD.

Figure 4:
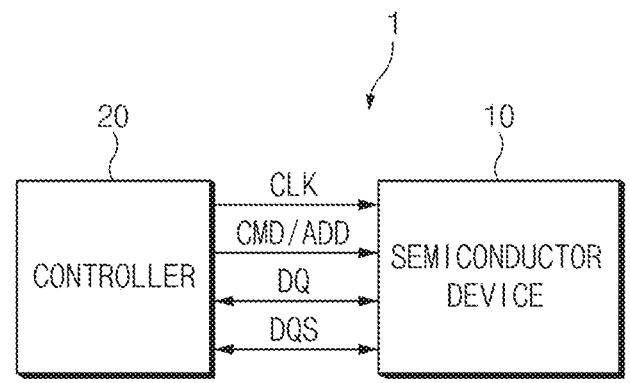
FIG. 4 is a configuration diagram illustrating a representation of an example of a semiconductor system including the semiconductor device of FIG. 1.

FIG. 4 is a configuration diagram illustrating a representation of an example of a semiconductor system 1 including the semiconductor device 10 of FIG. 1.

Referring to FIG. 4, the semiconductor system 1 may include a semiconductor device 10 and a controller 20.

Because the semiconductor device 10 corresponds to the semiconductor device 10 of FIG. 1, descriptions thereof will be omitted herein.

The controller 20 applies the command/address signal CMD/ADD to the semiconductor device 10. The controller 20 may be a device capable of controlling the semiconductor device 10 such as, for example, a memory controller, an application process (AP), or a central processing unit (CPU).

The controller 20 generates commands/address signals CMD/ADD based on the generated series of mode register commands as shown in FIG. 2. Namely, the controller 20 generates the command/address signal CMD/ADD based on the first mode register command MR1, the command/address signal CMD/ADD is generated based on the stabilization command (DSEL), the command/address signal CMD/ADD is generated based on the second mode register command MR2, the command/address signal CMD/ADD is generated based on the third mode register command MR3, and the command/address signal CMD/ADD is generated based on the precharge command (PCG).

The controller 20 may generate the commands/address signals CMD/ADD corresponding to the mode register commands, within a predetermined time interval, such that the series of operations described above may be performed. For example, the controller 20 may generate a third command/address signal after generating the second command address signal CMD/ADD a predetermined number of times. Further, the controller 20 may generate a first command/address signal CMD/ADD before the controller 20 generates the command/address signal CMD/ADD based on the second mode register command MR2, where the command/address signal CMD/ADD is transmitted to the semiconductor device 10 in an interval shorter than 15 ns, such that the second mode register commands MR2 are generated consecutively in an interval shorter than a time (for example, 15 ns) that data is read one time by the second mode register command MR2. According to this fact, the driving signal generation circuit 200 may retain the enable state of the fuse driving signal DRIVE_EN for a time that is sufficient for the fuse data FDATA to be read.

The controller 20 may transmit the command/address signal CMD/ADD in synchronization with a clock signal CLK. The semiconductor device 10 may output the output data DATA outputted from the output circuit 500, as a DQ signal, together with a data strobe signal DQS.

While various embodiments have been described above, it will be understood to those skilled in the art that the embodiments described are by way of example only. Accordingly, the semiconductor device, the semiconductor system and the operating method thereof described herein should not be limited based on the described embodiments.

What is claimed is:

1. A semiconductor device comprising:
   an internal command generation circuit suitable for generating a first internal command, a second internal command, and a third internal command based on a command/address signal;
   a nonvolatile memory circuit suitable for receiving a fuse address;
   a driving signal generation circuit suitable for enabling a fuse driving signal for reading fuse data from the nonvolatile memory circuit, wherein the fuse signal is enabled while the second internal command is inputted a predetermined number of times; and
   an output circuit suitable for outputting the fuse data in response to the third internal command,
   wherein the driving signal generation circuit comprises a counter for counting a number of times that the second internal command is inputted.

2. The semiconductor device according to claim 1, wherein the first, second, and third internal commands are mode register commands.

3. The semiconductor device according to claim 2, wherein the third mode register command is a mode register read command.

4. The semiconductor device according to claim 1, wherein the driving signal generation circuit enables the fuse driving signal when the second internal command is inputted a first time.

5. The semiconductor device according to claim 1, wherein the counter is enabled by the first internal command.

6. The semiconductor device according to claim 1, wherein the predetermined number of times is set such that the fuse driving signal is applied for a time that the fuse data is able to be outputted from the nonvolatile memory circuit.

7. The semiconductor device according to claim 1, further comprising:
   an address generation circuit suitable for generating the fuse address in response to the first internal command.

8. The semiconductor device according to claim 7, further comprising:
   the nonvolatile memory circuit suitable for outputting the fuse data stored at the fuse address, based on the fuse driving signal.

9. The semiconductor device according to claim 7, wherein the address generation circuit comprises:
   an internal command counter suitable for counting the second internal command and enabling an address increase signal when the predetermined number of times is reached; and
   an address increase circuit suitable for increasing the fuse address in response to the address increase signal.

10. A semiconductor system comprising:
    a controller suitable for generating a command/address signal a predetermined number of times; and
    a semiconductor device suitable for generating a first internal command and a second internal command based on the command/address signal, and retaining an enable state of a fuse driving signal for reading fuse data from a nonvolatile memory circuit based on a fuse address while the second internal command is generated the predetermined number of times,
    wherein the semiconductor device comprises a counter enabled by the first internal command and suitable for counting a number of times that the second internal command is inputted.

11. The semiconductor system according to claim 10,
    wherein the controller generates a first command/address signal before generating a second command/address signal, and
    wherein the semiconductor device generates a first internal command based on the first command/address signal, and enables the fuse driving signal in response to the first internal command.

12. The semiconductor system according to claim 11, wherein the semiconductor device comprises:
    an internal command generation circuit suitable for generating the first internal command based on the first command/address signal, and generating the second internal command based on the second command/address signal; and
    a driving signal generation circuit suitable for enabling the fuse driving signal in response to the first internal command, retaining the enable state of the fuse driving signal while the second internal command is inputted by the predetermined number of times.

13. The semiconductor system according to claim 12, wherein the first internal command and the second internal command are mode register commands.

14. The semiconductor system according to claim 12,
    wherein the controller generates a third command/address signal after generating the second command/address signal by the predetermined number of times,
    wherein the internal command generation circuit generates a third internal command based on the third command/address signal, and
    wherein the semiconductor device further comprises:
    an output circuit suitable for outputting the fuse data in response to the third internal command.

15. The semiconductor system according to claim 14, wherein the third internal command is a mode register read command.

16. A method for operating a semiconductor system, comprising:
    transmitting a first command/address signal by a controller;
    enabling a fuse driving signal, by a semiconductor device, in response to the first command/address signal;
    transmitting, by the controller, a second command/address signal a predetermined number of times;
    enabling a counter in response to a first internal command;

counting, by the counter, a number of times that the second internal command is inputted;

retaining an enable state of the fuse driving signal, by the semiconductor device, while the second command/address signal is transmitted the predetermined number of times; and outputting fuse data by a nonvolatile memory circuit based on the fuse driving signal and a fuse address.

17. The method according to claim 16, further comprising:

generating the fuse address by the semiconductor device in response to the first command/address signal, wherein, in the outputting of the fuse data, the nonvolatile memory circuit outputs the fuse data based on the fuse address.

18. The method according to claim 16, further comprising:

transmitting a third command/address signal by the controller, after the semiconductor device outputs the fuse data; and outputting the fuse data by the semiconductor device in response to the third command/address signal.

19. The semiconductor system according to claim 10, wherein the predetermined number of times is set such that the fuse driving signal is applied for a time that the fuse data is able to be outputted from the nonvolatile memory circuit.

20. The semiconductor system according to claim 10, wherein the semiconductor device further comprising: an address generation circuit suitable for generating a fuse address in response to the first internal command.

* * * * *